(12) United States Patent
Yeom et al.

(10) Patent No.: US 11,363,727 B1
(45) Date of Patent: Jun. 14, 2022

(54) TERMINAL APPARATUS AND TERMINAL EQUIPMENT INCLUDING THE SAME

(71) Applicant: Suprema Inc., Seongnam-si (KR)

(72) Inventors: Junsun Yeom, Seongnam-si (KR); Taehoon Lee, Seongnam-si (KR)

(73) Assignee: Suprema Inc., Seongnam-si (KR)

( * ) Notice: Subject to any disclaimer, the term of this patent is extended or adjusted under 35 U.S.C. 154(b) by 0 days.

(21) Appl. No.: 17/529,659

(22) Filed: Nov. 18, 2021

(30) Foreign Application Priority Data

Apr. 30, 2021 (KR) .................. 10-2021-0056697
Aug. 24, 2021 (KR) .................. 10-2021-0111446

(51) Int. Cl.
*H05K 5/02* (2006.01)
*H05K 7/14* (2006.01)

(52) U.S. Cl.
CPC ......... *H05K 5/0208* (2013.01); *H05K 5/0217* (2013.01); *H05K 7/1427* (2013.01)

(58) Field of Classification Search
None
See application file for complete search history.

(56) References Cited

U.S. PATENT DOCUMENTS

| | | | | |
|---|---|---|---|---|
| 4,343,574 A * | 8/1982 | Anders | ................ | B65G 51/28 406/13 |
| 4,841,755 A * | 6/1989 | Weinerman | ............... | E05B 9/08 292/DIG. 31 |
| 5,557,067 A * | 9/1996 | Messelhi | .................. | H02G 3/14 174/67 |
| 5,863,214 A * | 1/1999 | Hanak | ................. | H01R 13/639 439/352 |
| 2003/0001395 A1* | 1/2003 | Barthelet | ............ | H01M 50/262 292/175 |
| 2013/0037398 A1* | 2/2013 | Kobayashi | ............... | H01H 9/06 200/306 |
| 2015/0311687 A1* | 10/2015 | Caille | ..................... | H02G 3/12 174/502 |
| 2017/0034931 A1* | 2/2017 | Little | ..................... | H02S 40/30 |
| 2017/0047718 A1* | 2/2017 | Delmas | ................. | H02G 3/081 |
| 2017/0280574 A1* | 9/2017 | Takayuki | ............... | G06F 1/1658 |
| 2018/0213661 A1* | 7/2018 | Morihara | ............ | H05K 7/1427 |
| 2019/0131782 A1* | 5/2019 | Sylvester | ................ | H02G 3/16 |
| 2021/0098978 A1* | 4/2021 | Ishii | .................... | B60R 16/0238 |

* cited by examiner

*Primary Examiner* — Xanthia C Cunningham
(74) *Attorney, Agent, or Firm* — Maier & Maier, PLLC

(57) ABSTRACT

A terminal apparatus includes: a case configured to be selectively engaged with a bracket installed on a wall; and a locker unit configured to move with respect to the bracket to prevent the case from coming out of the engagement or to allow the case to come out of the engagement. The locker unit includes a first locker configured to move in a first direction by an external force applied by a user, and a second locker configured to move in a second direction different from the first direction by the movement of the first locker.

15 Claims, 10 Drawing Sheets

TERMINAL APPARATUS AND TERMINAL EQUIPMENT INCLUDING THE SAME

TECHNICAL FIELD

The present disclosure relates to a terminal apparatus and terminal equipment including the same.

BACKGROUND

In general, a terminal apparatus is a device that is connected to a communication circuit in a data transmission device or the like, and is used to input or output data through the communication circuit.

In this terminal apparatus, for example, there is a fingerprint recognition device in which when a fingerprint portion of a finger of a user comes into contact with on a fingerprint collecting surface, light of a light source is reflected and absorbed at valleys and ridges of the fingerprint, the reflected light is incident on a prism and formed on a lens system, and the light imaged on the lens system is detected through an image sensor. The fingerprint detected through the fingerprint recognition device is sent to an image processor through the image sensor, and the image processor compares the detected fingerprint with a registered fingerprint to recognize whether the detected fingerprint is the registered fingerprint or not.

When the terminal apparatus including the fingerprint recognition device, a face recognition device, and a card terminal is arbitrarily disassembled by an unauthorized outsider, important data stored in the terminal apparatus as well as information on a main design of the terminal apparatus may be tempered in hardware or software.

Meanwhile, this terminal apparatus is mainly supported and fixed by a bracket disposed on the wall adjacent to a door. The conventional bracket fixes the fingerprint recognition device in a screw connection method. However, this screw connection method has a problem in that it takes time to install the terminal apparatus and the convenience is lowered.

SUMMARY

In the terminal equipment according to one embodiment of the present disclosure, the terminal apparatus is connected to the bracket by a hook connection method, and thus, it is possible to shorten time for a user to install the terminal apparatus to the bracket.

In accordance with a first embodiment of the present disclosure, there is provided a terminal apparatus including: a case configured to be selectively engaged with a bracket installed on a wall; and a locker unit configured to be movable with respect to the bracket to prevent the case from coming out of the engagement or to allow the case to come out of the engagement, wherein the locker unit includes a first locker configured to move in a first direction by an external force applied by a user, and a second locker configured to move in a second direction different from the first direction by the movement of the first locker.

The case may include: a case body; and a case hook supporting the case body so that the case body is detachable from the bracket, wherein the case hook moves with respect to the bracket in a direction parallel to the wall to engage with the bracket.

The first locker may include a first inclined surface extending in an inclined direction different from the first direction and the second direction. The second locker may further include a locker body portion having a second inclined surface facing the first inclined surface. The second locker may be configured so that the second inclined surface slides relative to the first inclined surface and the second locker moves in the second direction when the first locker is moved in the first direction by the user, and the second direction may be perpendicular to the wall.

The first direction may be parallel to the wall.

The second locker may include a locking portion selectively in close contact with the bracket. The locking portion may extend in the second direction. The second direction may be perpendicular to the wall.

The terminal apparatus may further include an elastic portion disposed adjacent to the locker unit. The elastic portion may include a main elastic member applying a restoring force to the second locker to allow the second locker to move toward the bracket.

The elastic portion may further include an auxiliary elastic member applying a restoring force to the first locker in a direction opposite to the direction of the external force applied by the user.

The first locker may include a first inclined surface formed to extend in an inclined direction different from the first direction and the second direction. The second locker may further include a locker body portion having a second inclined surface opposite to the first inclined surface. The second inclined surface may slide relative to the first inclined surface and the second locker may move in the second direction when the first locker is moved in the first direction by the user, and the second direction may be parallel to the wall.

The inclined direction may be parallel to the wall.

The second locker may include a locking portion selectively in close contact with the bracket. The locking portion may extend in a direction perpendicular to the wall, and the second direction may be parallel to the wall.

The terminal apparatus may further include an elastic portion disposed adjacent to the locker unit. The elastic portion may include a main elastic member applying a restoring force to the second locker in a direction opposite to the direction in which the second locker moves when the user applies an external force to the first locker.

The terminal apparatus may further include: a detection switch for detecting a separation between the case and the bracket based on whether the detection switch is contact with the locker unit or not; and a temper unit operating a temper function when the separation is detected by the detection switch.

In accordance with a second embodiment of the present disclosure, there is provided terminal equipment including: a bracket installed on a wall; and a terminal apparatus. The terminal apparatus may include: a case configured to be selectively engaged with the bracket installed on the wall; and a locker unit configured to be movable with respect to the bracket to prevent the case from coming out of the engagement or to allow the case to come out of the engagement. The locker unit may include a first locker configured to move in a first direction by an external force applied by a user, and a second locker configured to move in a second direction different from the first direction by the movement of the first locker.

The case may include a case body and a case hook supporting the case body so that the case body is detachable from the bracket. The bracket may include a hook connector selectively engaging with the case hook. The case hook may be configured to move with respect to the hook connector in a direction parallel to the wall to engage with the hook connector.

The second locker may include a locking portion extending in a direction perpendicular to the wall, and the bracket may include a locker connector configured to be selectively in contact with the locking portion.

DETAILED DESCRIPTION OF THE EMBODIMENTS

Hereinafter, specific embodiments for implementing a spirit of the present disclosure will be described in detail with reference to the drawings.

In describing the present disclosure, detailed descriptions of known configurations or functions may be omitted to clarify the present disclosure.

When an element is referred to as being 'connected' to, 'fixed' to, 'supported' by, or 'transferred' to another element, it should be understood that the element may be directly connected to, fixed to, supported by, or transferred to another element, but that other elements may exist in the middle.

The terms used in the present disclosure are only used for describing specific embodiments, and are not intended to limit the present disclosure. Singular expressions include plural expressions unless the context clearly indicates otherwise.

Further, in the present disclosure, it is to be noted that expressions, such as the upper side and the lower side, are described based on the illustration of drawings, but may be modified if directions of corresponding objects are changed. For the same reasons, some components are exaggerated, omitted, or schematically illustrated in the accompanying drawings, and the size of each component does not fully reflect the actual size.

Terms including ordinal numbers, such as first and second, may be used for describing various elements, but the corresponding elements are not limited by these terms. These terms are only used for the purpose of distinguishing one element from another element.

In the present specification, it is to be understood that the terms such as "including" are intended to indicate the existence of the certain features, areas, integers, steps, actions, elements, combinations, and/or groups thereof disclosed in the specification, and are not intended to preclude the possibility that one or more other certain features, areas, integers, steps, actions, elements, combinations, and/or groups thereof may exist or may be added.

Figure 1:
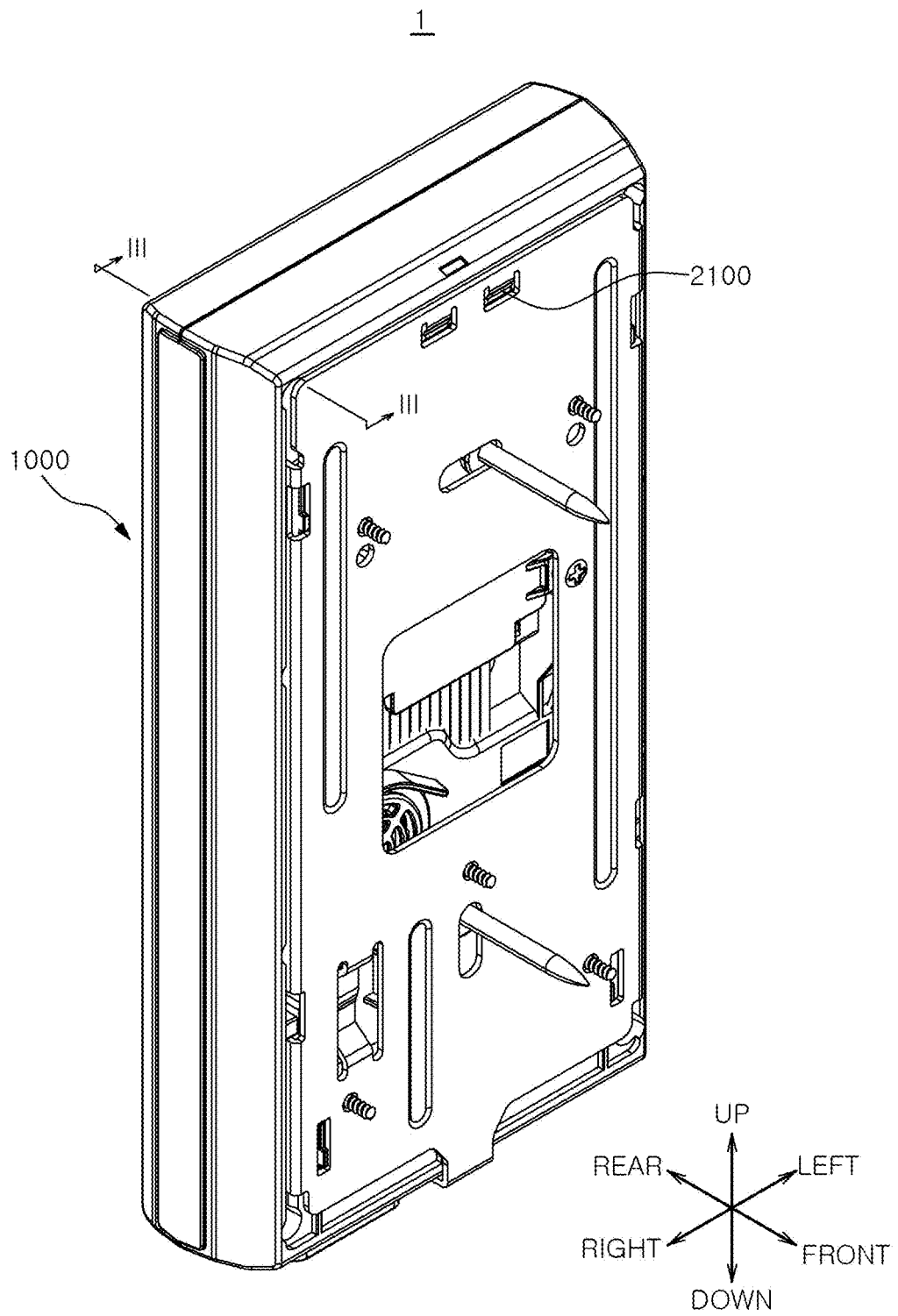
FIG. 1 is a perspective view of terminal equipment according to a first embodiment of the present disclosure.
Figure 2:
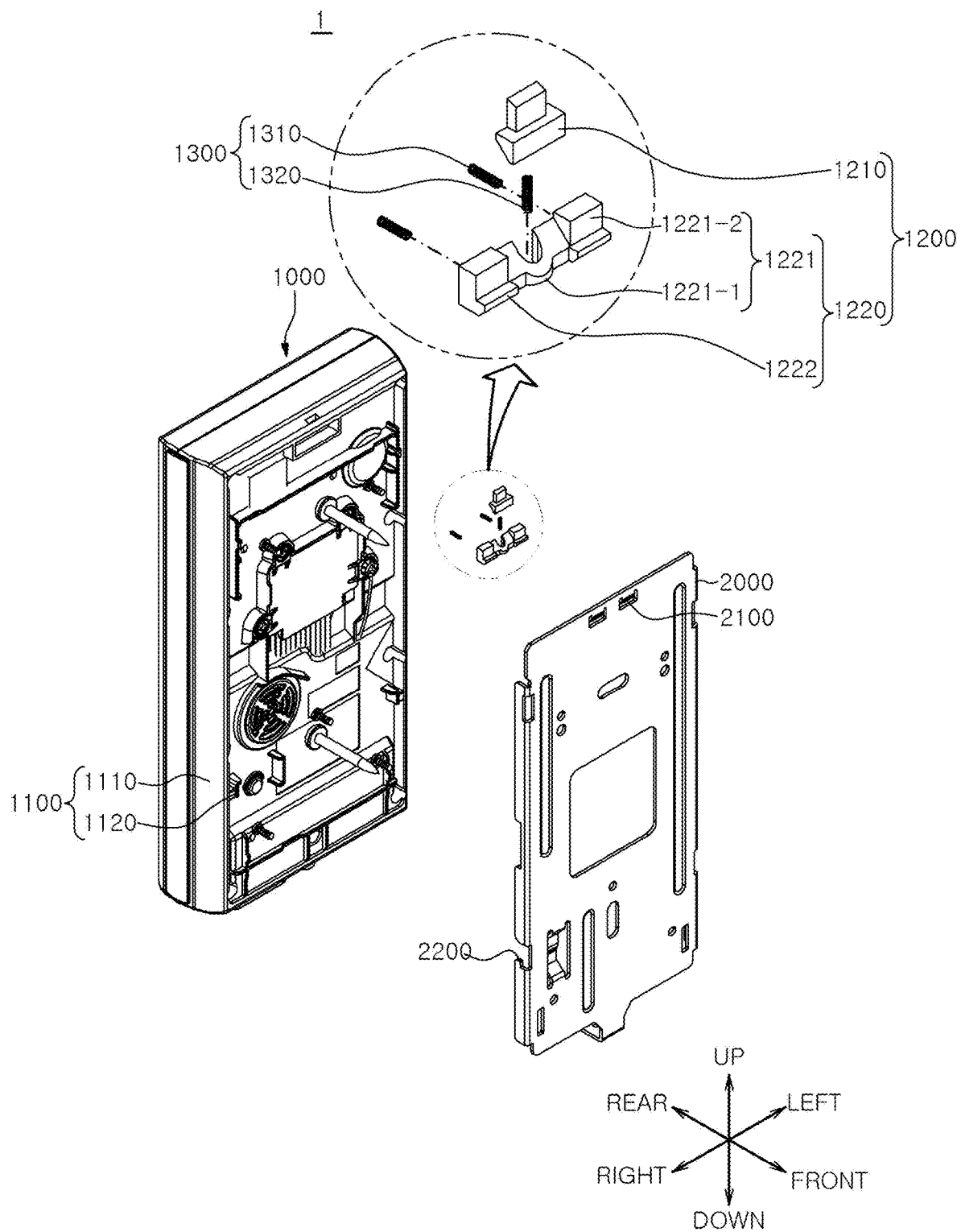
FIG. 2 is an exploded perspective view of the terminal equipment according to the first embodiment of the present disclosure.

In the present specification, expressions of upper, lower, upper, lower, or the like are described with reference to the illustration of FIG. 1, and it should be noted in advance that they may be expressed differently when a direction of the corresponding object is changed. In addition, a first direction means an up-down direction, "upward" is defined as a direction in which the hook connector 2200 faces a locker connector 2100, and "downward" is defined as a direction opposite to the "upward". Moreover, in the present specification, the first direction may be referred to as a "push direction". A second direction in a first embodiment means a front-rear direction, and a second direction in a second embodiment means a direction perpendicular to the up-down direction and the front-rear direction. In the present specification, the second direction may be referred to as a "locking direction". The "front" is defined as a direction from a terminal apparatus 1000 toward a bracket 2000, and the "rear" is defined as a direction opposite to the "front".

Hereinafter, a detailed configuration of terminal equipment 1 according to the first embodiment of the present disclosure will be described with reference to the drawings.

Figure 3:
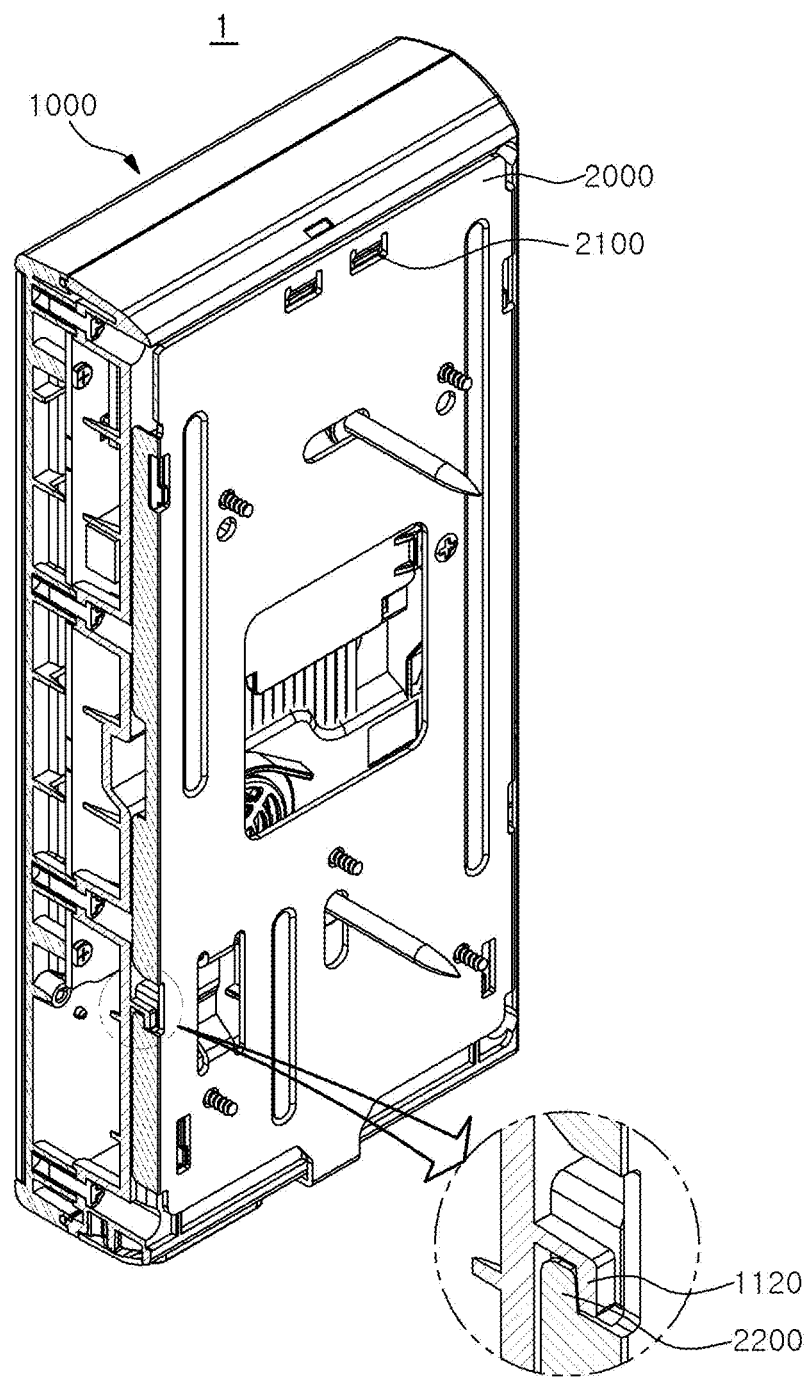
FIG. 3 is a cross-sectional perspective view taken along line 111-111 of FIG. 1.
Figure 4:
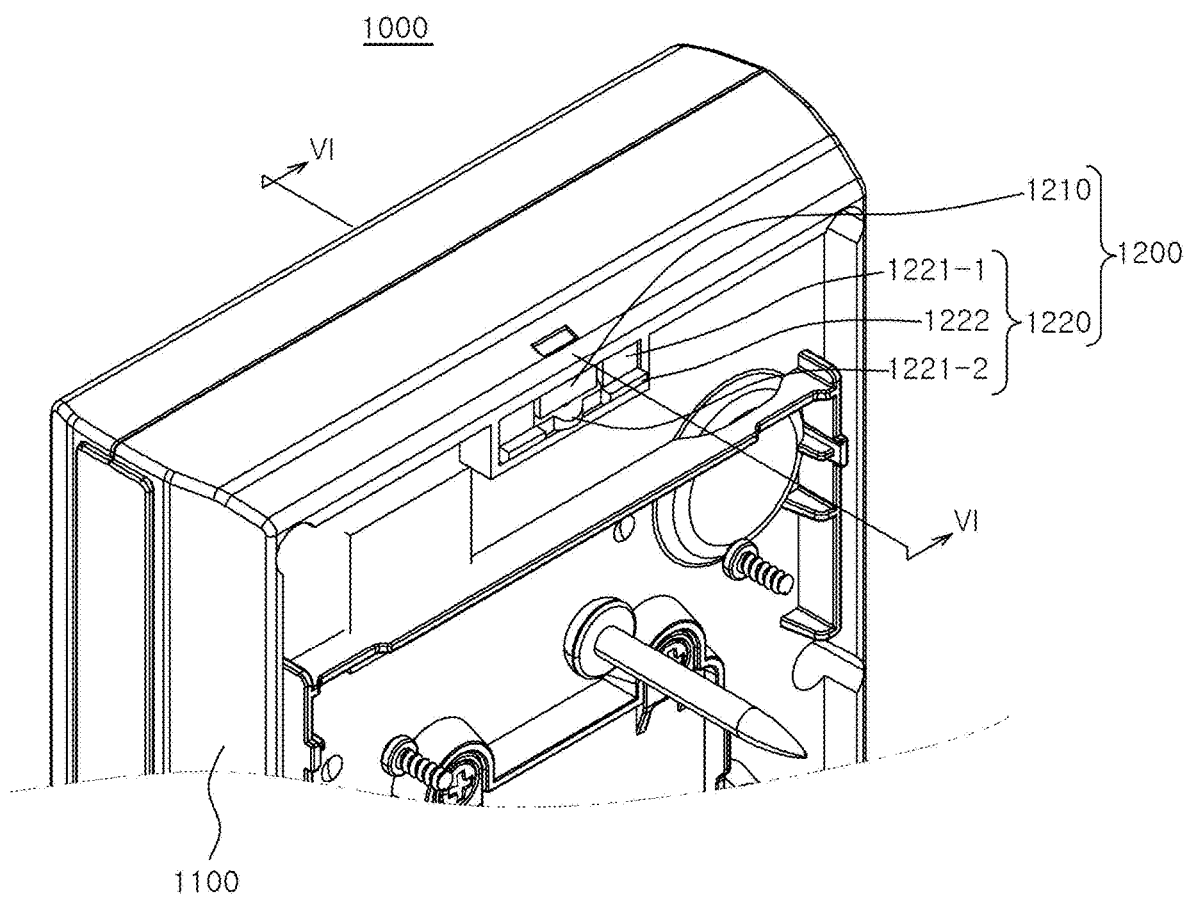
FIG. 4 is a perspective view illustrating a state in which the locker unit of the terminal apparatus according to the first embodiment of the present disclosure does not move.
Figure 5:
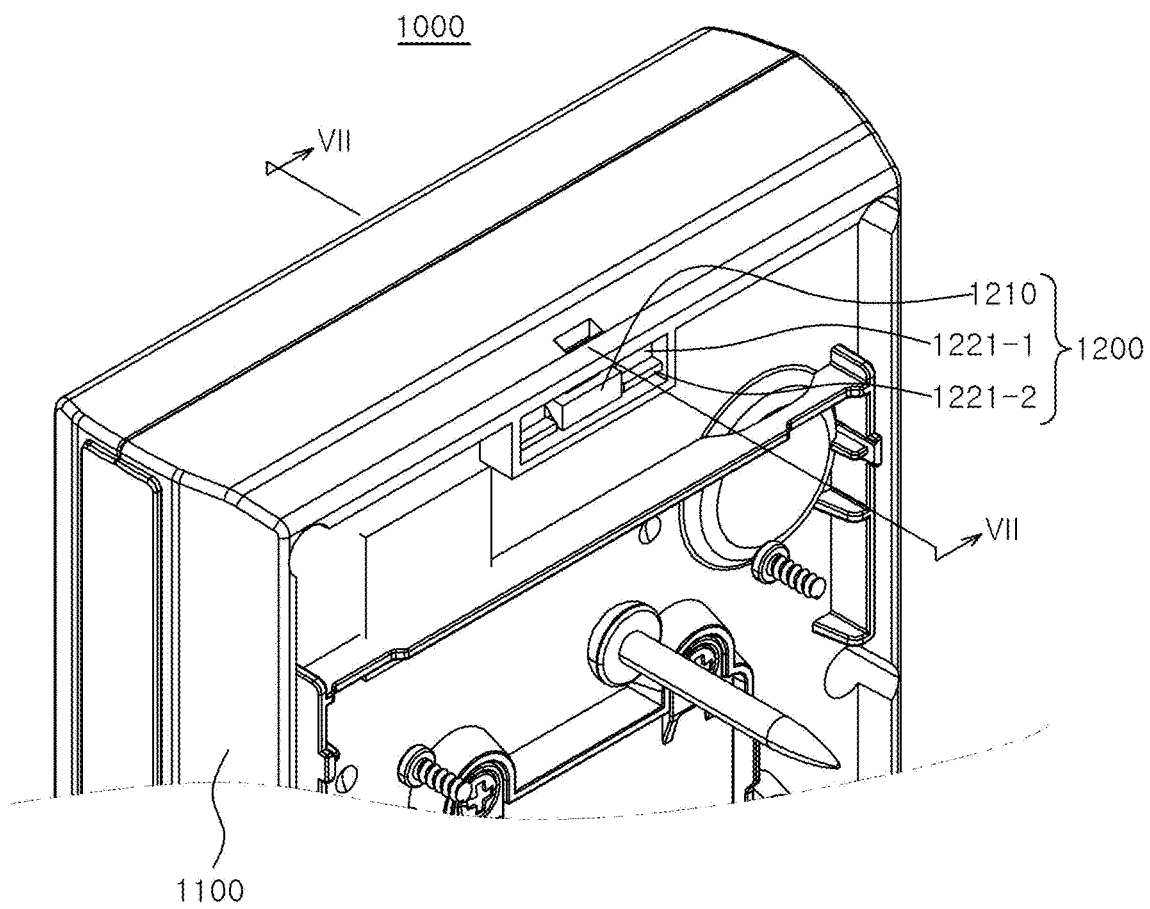
FIG. 5 is a perspective view illustrating a state in which the locker unit of FIG. 4 is moved.
Figure 6:
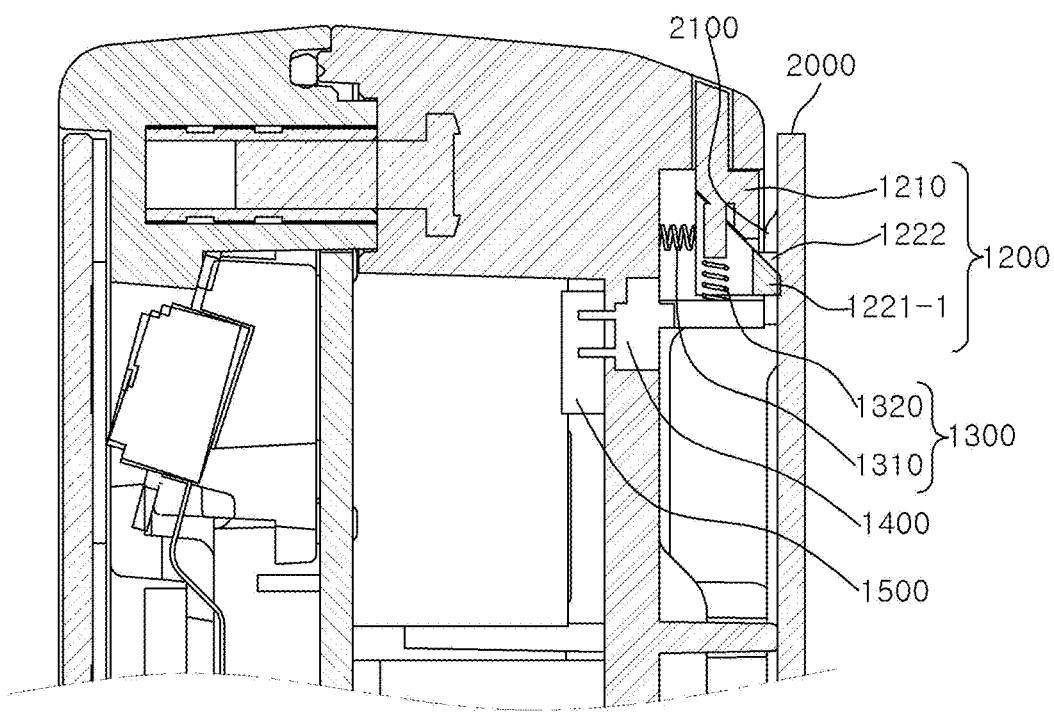
FIG. 6 is a cross-sectional view taken along line VI-VI of FIG. 4.
Figure 7:
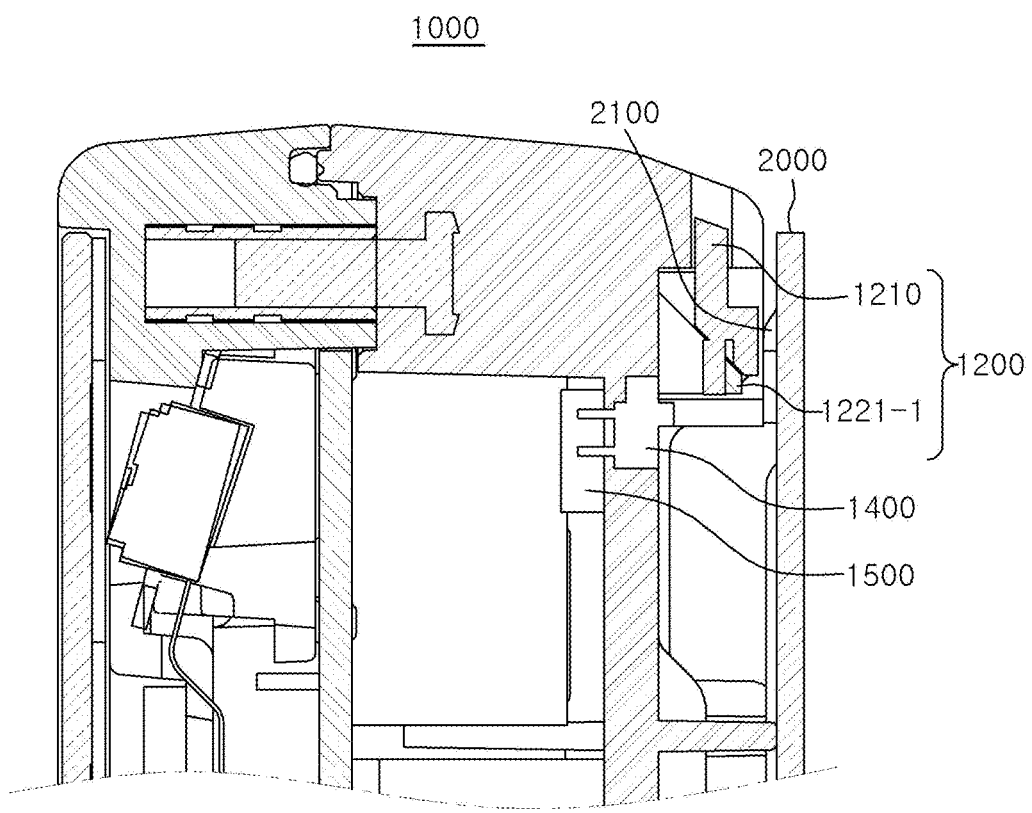
FIG. 7 is a cross-sectional view taken along line VII-VII of FIG. 5.

Hereinafter, referring to FIGS. 1 and 3, in the terminal equipment 1 according to the first embodiment of the present disclosure, the terminal apparatus 1000, which will be described below, may be installed on the bracket installed on a wall through a hook connection method. The terminal equipment 1 may be configured as wall-mounted type equipment that is fixedly installed on a wall. The terminal equipment 1 may include the terminal apparatus 1000 and a bracket 2000.

Referring to FIGS. 4 to 7, the terminal apparatus 1000 may include a fingerprint recognition device capable of collecting a fingerprint of a finger in contact with a fingerprint collecting surface, a face recognition device for recognizing identity of a user through a face recognition unit, a card terminal for recognizing user information through information input to a card, or the like. The terminal apparatus 1000 may be detachably connected to the bracket 2000. The terminal apparatus 1000 may include a case 1100, a locker unit 1200, an elastic portion 1300, a detection switch 1400, and a tamper unit 1500.

The case 1100 may protect the locker unit 1200, the elastic portion 1300, the detection switch 1400, and the tamper unit 1500 from external impact. In addition, the case 1100 may support the locker unit 1200, the elastic portion 1300, the detection switch 1400, and the tamper unit 1500. The case 1100 may be selectively in engagement with respect to the bracket 2000 installed on the wall. The case 1100 may include a case body 1110 and a case hook 1120.

A locker accommodating space in which the locker unit 1200 can be accommodated may be formed in an upper portion of the case body 1110. In addition, the case body 1110 may include a fixing pin that can be inserted and fixed to an entrance wall. The case body 1110 may be detachably connected to the bracket 2000. When the case body 1110 is connected to the bracket 2000, the case body 1110 may be supported by the bracket 2000. In addition, a locker insertion hole into which a portion of the locker unit 1200 can be inserted may be formed at one end of the case body 1110.

For example, one end of the case body 1110 may be an upper end or a lower end of the case body 1110. The locker insertion hole may be a through hole extending in the up-down direction.

The case hook 1120 may support the case body 1110 so that the case body 1110 is detachable from the bracket 2000. The case hook 1120 may be formed on both sides of the case body 1110. The case hook 1120 may be integrally formed with the case body 1110. The case hook 1120 may have a hook shape with an end facing downward or upward. The case hook 1120 may move with respect to the bracket 2000 in a direction parallel to the wall to engage the bracket 2000. The direction parallel to the wall may be, for example, the up-down direction.

The case 1100 can be selectively engaged with the bracket 2000 by the locker unit 1200. For example, the locker unit 1200 may prevent the case 1100 from coming out of an engaged state (hereinafter, "locking"), or allow the case 1100 to come out of the engaged state (hereinafter, "unlocking"). The locker unit 1200 may be configured to be movable with respect to the bracket 2000. The locker unit 1200 may include a first locker 1210 and a second locker 1220.

The first locker 1210 may provide a push region to be pushed. The first locker 1210 may be configured to be movable in the first direction by an external force applied by the user. For example, the first locker 1210 may move in the up-down direction. One surface of the first locker 1210 may provide the push region for being pushed by the user. For example, an upper surface of the first locker 1210 may provide the push region pushed downward by the user. When the first locker 1210 moves downward by a predetermined distance, the case 1100 and the bracket 2000 may be unlocked.

A first inclined surface may be formed on a lower side of the first locker 1210. The first inclined surface may extend in an inclined direction different from the up-down direction and the front-rear direction. For example, the inclination direction may be a direction perpendicular to a direction perpendicular to the up-down direction and the front-rear direction. In other words, the inclination direction may be a direction perpendicular to a left-right direction. An angle between the first inclined surface and the ground may be 0° or more and 90° or less.

The second locker 1220 may be configured to be movable in a direction different from the up-down direction by the movement of the first locker 1210. For example, the second locker 1220 may be configured to be movable in the front-rear direction. As a more detailed example, when the first locker 1210 moves downward, the second locker 1220 may move backward. Moreover, when the first locker 1210 moves upward, the second locker 1220 may move forward.

A second inclined surface opposite to the first inclined surface may be formed on the upper portion of the second locker 1220. The second inclined surface may extend along the inclined direction. The second locker 1220 may be configured such that, when the first locker 1210 is moved in the up-down direction by the user, the second inclined surface slides relative to the first inclined surface to move in the front-rear direction. In other words, the first locker 1210 and the second locker 1220 may be configured so that the inclined surfaces move relative to each other in a state of being in contact with each other. The second locker 1220 may include a locker body portion 1221 and a locking portion 1222.

The locker body portion 1221 may include a center body 1221-1 and side bodies 1221-2. The center body 1221-1 may refer to a central portion of the locker body portion 1221. The side bodies 1221-2 may be connected to both sides of the center body 1221-1, respectively. In addition, the center body 1221-1 and the side bodies 1221-2 may be integrally formed.

The locking portion 1222 may selectively be in close contact with the bracket 2000. For example, an upper surface of the locking portion 1222 may be in close contact with a lower surface of the locker connector 2100 to be described below. When the locking portion 1222 and the locker connector 2100 are unlocked and the case 1100 comes out of the engaged state, the case 1100 and the bracket 2000 may be separated from each other.

The locking portion 1222 may extend in the front-rear direction. For example, the locking portion 1222 may extend from the front surface of the side body 1221-2 in the front-rear direction. The locking portion 1222 may have a shape protruding forward. The locking portion 1222 may move along the front-rear direction together with the locker body portion 1221.

The elastic portion 1300 may be contracted when an external force is applied to the locker unit 1200 and extend when the external force applied to the locker unit 1200 is removed. The elastic portion 1300 may provide a restoring force to the locker unit 1200. For example, the elastic portion 1300 may restore the locker unit 1200 to an original position thereof when the external force applied to the locker unit 1200 by the user is removed. The elastic portion 1300 may be disposed adjacent to the locker unit 1200. The elastic portion 1300 may be, for example, a compression coil spring. In addition, the elastic portion 1300 may be disposed in the locker accommodating space. The elastic portion 1300 may include a main elastic member 1310 and an auxiliary elastic member 1320.

The main elastic member 1310 may be contracted when an external force is applied to the second locker 1220 by the first locker 1210, and may extend when the external force applied to the second locker 1220 is removed. In other words, the main elastic member 1310 may be contracted when an external force is applied to the first locker 1210 and extend when the external force applied to the first locker 1210 is removed. The main elastic member 1310 may provide a restoring force to the second locker 1220 in a direction in which the second locker 1220 approaches the bracket 2000. For example, the direction in which the second locker 1220 approaches the bracket 2000 may be a forward direction. The main elastic member 1310 may move the second locker 1320 forward when the external force applied to the first locker 1210 is removed.

The main elastic member 1310 may be disposed between the case body 1110 and the second locker 1220. For example, the main elastic member 1310 may be disposed between the case body 1110 and the side body 1221-2. The main elastic member 1310 may be, for example, a spring extending in the front-rear direction.

The auxiliary elastic member 1320 may be contracted when an external force is applied to the first locker 1210 by the user, and may extend when the external force applied to the first locker 1210 is removed. The auxiliary elastic member 1320 may provide a restoring force to the first locker 1210 in a direction opposite to the direction of the external force applied by the user. The direction opposite to the direction of the external force applied by the user may be an upward direction. For example, the auxiliary elastic member 1320 may be contracted when an external force is applied downward to the first locker 1210, and the first locker 1210 may extend when the external force applied to the first locker 1210 is removed.

The auxiliary elastic member 1320 may be disposed between the case body 1110 and the first locker 1210. The auxiliary elastic member 1320 may be, for example, a spring extending in the vertical direction.

Referring to FIGS. 6 and 7 again, as the detection switch 1400 is selectively pushed by the second locker 1220, it is possible to detect whether the case 1100 and the bracket 2000 are separated from each other. For example, when the detection switch 1400 is pushed by a rear end of the second locker 1220, the detection switch 1400 may generate a separation signal. The detection switch 1400 may be, for example, a tact switch. The detection switch 1400 may transmit the separation signal to the tamper unit 1500.

The tamper unit 1500 may receive a separation signal from the detection switch 1400 to operate a tamper function. For example, the tamper unit 1500 may turn on the tamper function when receiving the separation signal from the detection switch 1400. The tamper unit 1500 may include, for example, a printed circuit board (PCB) that operates a programmed tamper function. It is possible to prevent the information input to the terminal apparatus 1000 from being stolen by an unauthorized outsider through the tamper unit 150.

The bracket 2000 may fix the terminal apparatus 1000 to a predetermined entrance wall. In addition, the bracket 2000 may be selectively connected to the terminal apparatus 1000 to support the terminal apparatus 1000. The bracket 2000 may include a locker connector 2100 and a hook connector 2200.

The locker connector 2100 may be selectively in close contact with the locking portion 1222. For example, the lower surface of the locker connector 2100 and the upper surface of the locking portion 1222 may be selectively in close contact with each other. When the first locker 1210 moves downward by a predetermined distance, the locker connector 2100 may be in close contact with the locking portion 1222. The locker connector 2100 may have a shape such that the lower surface thereof faces the upper surface of the locking portion 1222. In addition, the locker connector 2100 may have a shape protruding toward the rear.

The hook connector 2200 may be selectively engaged with the case hook 1120. The hook connector 2200 may have a shape corresponding to the case hook 1120. For example, one end of the hook connector 2200 may be in the shape of a hook facing upward, and one end of the case hook 1120 may be in the shape of a hook facing downward. However, a spirit of the present disclosure is not necessarily limited thereto, and one end of the hook connector 2200 may have a hook shape facing downward, and one end of the case hook 1120 may have a hook shape facing upward.

Hereinafter, the operation of the terminal equipment 1 according to the embodiment of the present disclosure will be described.

In the terminal equipment 1, the hook connector 2200 and the case hook 1120 are engaged with each other, and the case 1100 and the bracket 2000 are locked through the locker unit 1200 to fix the terminal apparatus 1000 to the bracket 2000.

Moreover, the terminal equipment 1 may turn on the tamper function when an unauthorized external person applies an external force to the locker unit 1200 to unlock the locker unit 1200.

The terminal equipment 1 can fix the terminal apparatus 1000 to the bracket 2000 without a screw through the locker unit 1200, the case hook 1120, and the hook connection 2200, and thus, it is possible to easily install the terminal apparatus 1000.

In addition, in the terminal equipment 1, when the terminal apparatus 1000 is separated from the bracket 2000, the tamper function is operated. Accordingly, it is possible to prevent the information input into the terminal apparatus 1000 from being stolen by an unauthorized outsider.

Figure 8:
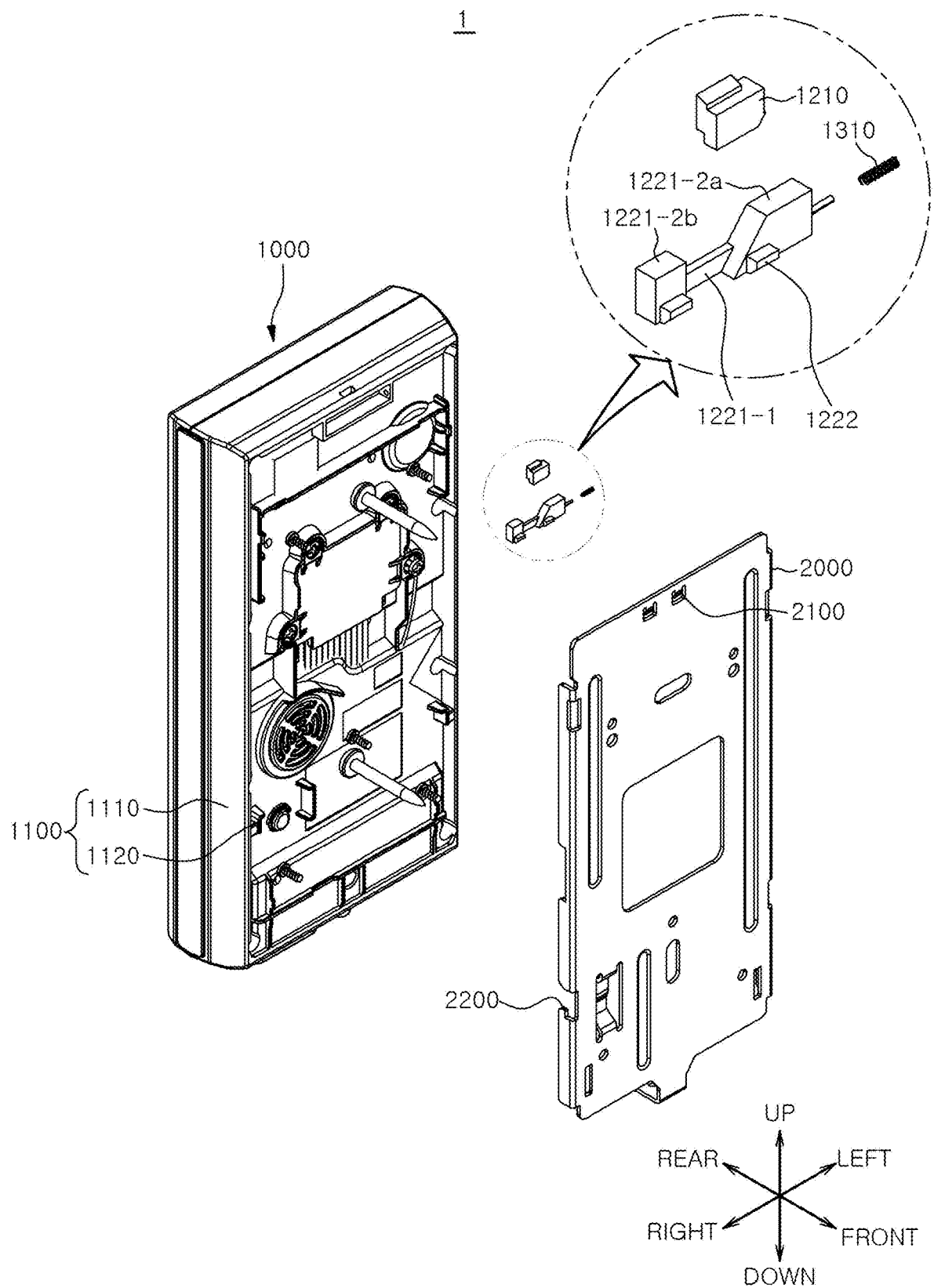
FIG. 8 is an exploded perspective view of terminal equipment according to a second embodiment of the present disclosure.
Figure 9:
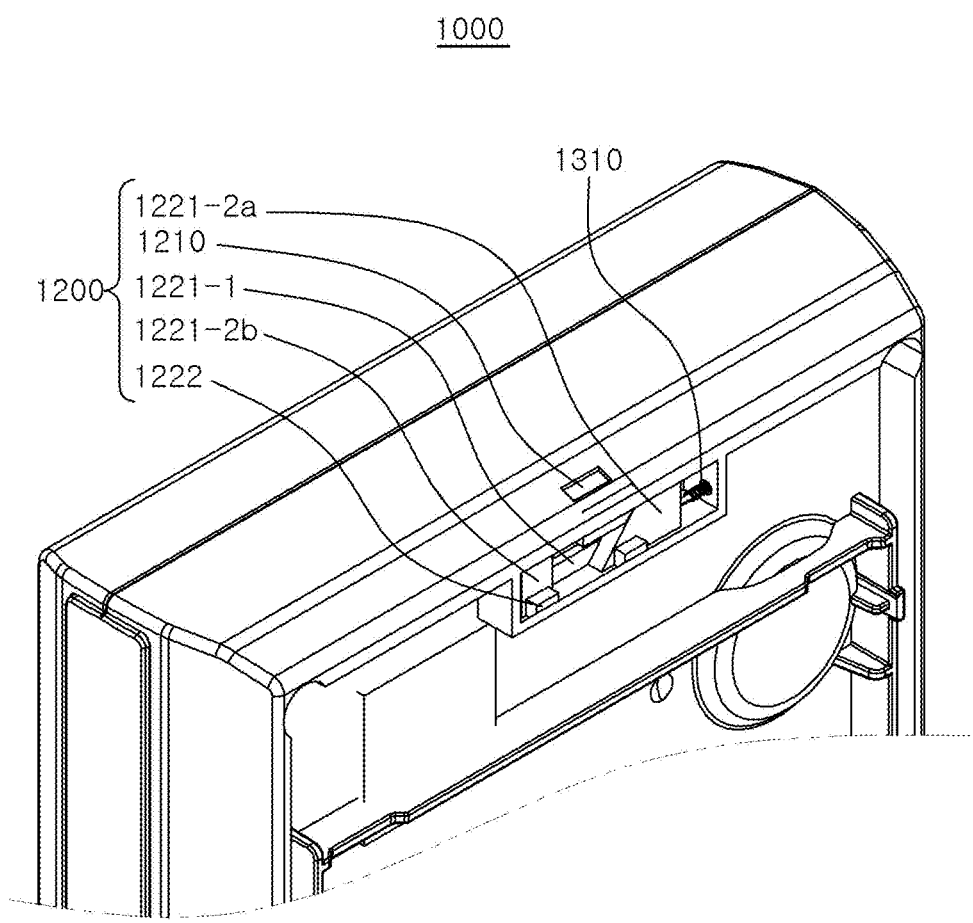
FIG. 9 is a perspective view illustrating a state in which a locker unit of the terminal apparatus according to the second embodiment of the present disclosure does not move.
Figure 10:
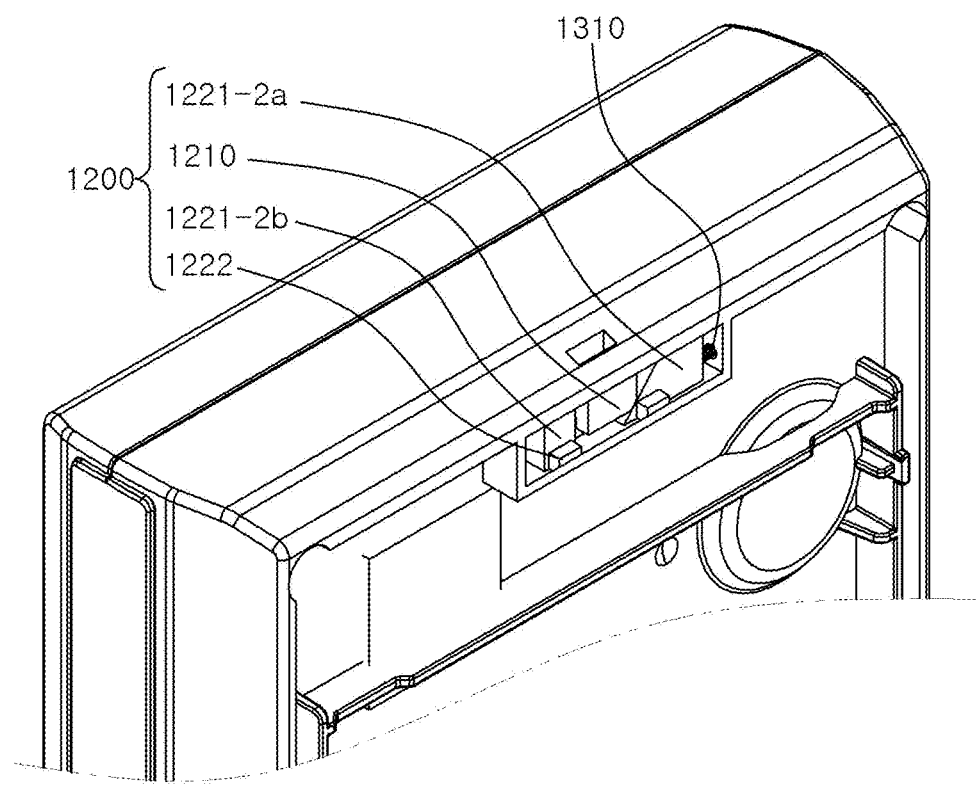
FIG. 10 is a perspective view illustrating a state in which the locker unit of FIG. 9 is moved.

Meanwhile, in addition to this configuration, according to a second embodiment of the present disclosure, the second direction may be a direction different from the up-down direction and the front-rear direction. Hereinafter, the second embodiment of the present disclosure will be described with reference to FIGS. 8 to 10. In the descriptions of the second embodiment, differences compared with the above-described embodiment will be mainly described, and the same description and reference numerals refer to the above-described embodiment.

The second locker 1220 may move in the second direction. The second direction may be, for example, a direction perpendicular to the up-down direction and the front-rear direction. In other words, the second direction may be the left-right direction determined by the up-down direction and the front-rear direction. For example, when the first locker 1210 moves downward, the second locker 1220 may move toward one side direction in a direction perpendicular to the up-down direction and the front-rear direction. The one side direction in the direction perpendicular to the up-down direction and the front-rear direction may be, for example, a left direction.

The locker body portion 1221 may include a center body 1221-1 and a side body 1221-2. In addition, the side body 1221-2 may include a first side body 1221-2a and a second side body 1221-2b connected to both sides of the center body 1221-1.

The first side body 1221-2a may be connected to a left side of the center body 1221-1. A second inclined surface extending in an inclined direction may be formed on an upper surface of one side of the first side body 1221-2a. The inclination direction may be a direction different from the up-down direction and the second direction and parallel to the wall. In addition, an angle between the second inclined surface and the ground may be 0° or more and 90° or less.

The main elastic member 1310 may be disposed adjacent to one side of the first side body 1221-2a. The main elastic member 1310 may provide a restoring force in a direction opposite to the direction in which the second locker 1220 moves when the user applies an external force to the first locker 1210. For example, when the user applies an external force to the first locker 1210, the direction opposite to the direction in which the second locker 1220 moves may be a left direction. The main elastic member 1310 may move the second locker 1220 to the right when the external force applied to the first locker 1210 is removed.

The examples of the present disclosure have been described above as specific embodiments, but these are only examples, and the present disclosure is not limited thereto, and should be construed as having the widest scope according to the technical spirit disclosed in the present specification. A person skilled in the art may combine/substitute the disclosed embodiments to implement a pattern of a shape that is not disclosed, but it also does not depart from the scope of the present disclosure. In addition, those skilled in the art can easily change or modify the disclosed embodiments based on the present specification, and it is clear that such changes or modifications also belong to the scope of the present disclosure.

What is claimed is:

1. A terminal apparatus comprising:
a case configured to be selectively engaged with a bracket installed on a wall; and
a locker unit configured to be movable with respect to the bracket to prevent the case from coming out of the engagement or to allow the case to come out of the engagement,
wherein the locker unit includes a first locker configured to move in a first direction by an external force applied by a user, and a second locker configured to move in a second direction different from the first direction by the movement of the first locker.

2. The terminal apparatus of claim 1, wherein the case includes:
a case body; and
a case hook supporting the case body so that the case body is detachable from the bracket,
wherein the case hook moves with respect to the bracket in a direction parallel to the wall to engage with the bracket.

3. The terminal apparatus of claim 1, wherein the first locker includes a first inclined surface extending in an inclined direction different from the first direction and the second direction,
the second locker further includes a locker body portion having a second inclined surface facing the first inclined surface,
the second locker is configured so that the second inclined surface slides relative to the first inclined surface and the second locker moves in the second direction when the first locker is moved in the first direction by the user, and
the second direction is perpendicular to the wall.

4. The terminal apparatus of claim 3, wherein the first direction is parallel to the wall.

5. The terminal apparatus of claim 1, wherein the second locker includes a locking portion selectively in close contact with the bracket,
the locking portion extends in the second direction, and
the second direction is perpendicular to the wall.

6. The terminal apparatus of claim 1, further comprising an elastic portion disposed adjacent to the locker unit,
wherein the elastic portion includes a main elastic member applying a restoring force to the second locker to allow the second locker to move toward the bracket.

7. The terminal apparatus of claim 6, wherein the elastic portion further includes an auxiliary elastic member applying a restoring force to the first locker in a direction opposite to the direction of the external force applied by the user.

8. The terminal apparatus of claim 1, wherein the first locker includes a first inclined surface formed to extend in an inclined direction different from the first direction and the second direction,
the second locker further includes a locker body portion having a second inclined surface opposite to the first inclined surface,
the second inclined surface slides relative to the first inclined surface and the second locker moves in the second direction when the first locker is moved in the first direction by the user, and
the second direction is parallel to the wall.

9. The terminal apparatus of claim 8, wherein the inclined direction is parallel to the wall.

10. The terminal apparatus of claim 1, wherein the second locker includes a locking portion selectively in close contact with the bracket,
the locking portion extends in a direction perpendicular to the wall, and
the second direction is parallel to the wall.

11. The terminal apparatus of claim 1, further comprising an elastic portion disposed adjacent to the locker unit,
wherein the elastic portion includes a main elastic member applying a restoring force to the second locker in a direction opposite to the direction in which the second locker moves when the user applies an external force to the first locker.

12. The terminal apparatus of claim 1, further comprising:
a detection switch for detecting a separation between the case and the bracket based on whether the detection switch is contact with the locker unit or not; and
a temper unit operating a temper function when the separation is detected by the detection switch.

13. Terminal equipment, comprising:
a bracket installed on a wall; and
a terminal apparatus,
wherein the terminal apparatus includes:
a case configured to be selectively engaged with the bracket installed on the wall; and
a locker unit configured to be movable with respect to the bracket to prevent the case from coming out of the engagement or to allow the case to come out of the engagement,
wherein the locker unit includes a first locker configured to move in a first direction by an external force applied by a user, and a second locker configured to move in a second direction different from the first direction by the movement of the first locker.

14. The terminal equipment of claim 13, wherein the case includes a case body and a case hook supporting the case body so that the case body is detachable from the bracket,
the bracket includes a hook connector selectively engaging with the case hook, and
the case hook is configured to move with respect to the hook connector in a direction parallel to the wall to engage with the hook connector.

15. The terminal equipment of claim 14, wherein the second locker includes a locking portion extending in a direction perpendicular to the wall, and
the bracket includes a locker connector configured to be selectively in contact with the locking portion.

* * * * *